United States Patent [19]

Won et al.

[11] Patent Number: 5,147,809
[45] Date of Patent: Sep. 15, 1992

[54] METHOD OF PRODUCING A BIPOLAR TRANSISTOR WITH A LATERALLY GRADED EMITTER (LGE) EMPLOYING A REFILL METHOD OF POLYCRYSTALLINE SILICON

[75] Inventors: Tae-Young Won; Seog-Heon Han; Moon-Ho Kim, all of Seoul; Jang-Man Ko, Inchon, all of Rep. of Korea

[73] Assignee: Samsung Electronics Co., Ltd., Suweon, Rep. of Korea

[21] Appl. No.: 747,634

[22] Filed: Aug. 20, 1991

[30] Foreign Application Priority Data

Feb. 21, 1991 [KR] Rep. of Korea ............. 91-2805

[51] Int. Cl.$^5$ ........................... H01L 21/265
[52] U.S. Cl. ........................ 437/31; 437/162; 437/150; 437/154; 437/191; 437/909; 148/DIG. 10; 148/DIG. 124
[58] Field of Search ............ 437/31, 162, 59, 150, 437/154, 191, 909; 148/DIG. 10, DIG. 124

[56] References Cited

U.S. PATENT DOCUMENTS 4,584,055 4/1986 Kayanuma et al. ............. 437/162
4,975,381 12/1990 Taka et al. ........................ 437/31

Primary Examiner—Brian E. Hearn
Assistant Examiner—Tuan Nguyen
Attorney, Agent, or Firm—Cushman, Darby & Cushman

[57] ABSTRACT

A method for manufacturing a bipolar transistor semiconductor device for preventing a degradation phenomenon of the transistor resulting from a reduction of a lateral electric field intensity. This is achieved by grading an emitter junction by way of refilling an emitter window with polycrystalline silicon. The resulting transistor structure overcomes the etch stop barrier by removing layer of oxide disposed below a layer of nitride along the region where formation of removing sidewalls of polycrystalline silicon have been formed. Subsequently, a doping distribution of the laterally graded emitter junction can easily be obtained by refilling the emitter window with the removed oxide layer with polycrystalline silicon. Because the shallowness of the oxide layer can be selectively and easily controlled, a thickness of the sidewalls is chosen which most efficiently raises the lateral electric field intensity of the transistor junction.

6 Claims, 2 Drawing Sheets

METHOD OF PRODUCING A BIPOLAR TRANSISTOR WITH A LATERALLY GRADED EMITTER (LGE) EMPLOYING A REFILL METHOD OF POLYCRYSTALLINE SILICON

BACKGROUND OF THE INVENTION

1. Field of the Invention

The present invention relates to a method for producing a bipolar transistor having a laterally graded emitter, and more particularly to a method for producing a bipolar transistor which prevents a degradation phenomenon of the transistor resulting from a reduction in the lateral electric field intensity. This is achieved by grading an emitter junction by way of refilling polycrystalline silicon along an emitter window.

2. Description of the prior art

In general, a hot carrier phenomenon occurring in response to a reverse bias in an emitter junction heightens a degradation of a bipolar transistor fabricated using a conventional method for producing a BiCMOS, or a submicron grade (under 1 μm), bipolar transistor.

To improve the degradation of a transistor resulting from a hot carrier phenomenon, a Mitsubishi LSI R&D center in Japan introduced, at IEMD in 1990, a method for fabricating a semiconductor device with improved degradation by reducing lateral electric field intensity by laterally grading the shape of the transistor emitter junction.

FIG. 1 is a vertical sectional view explaining a conventional bipolar transistor.

As shown in FIG. 1, a conventional method of producing a transistor comprises a step of growing an n+ buried layer (not shown) and an n− epitaxial layer 1 over p type substrate (not shown), growing oxide layer 3a over epitaxial layer 1, forming p type base region 2 in epitaxial layer 1, growing oxide layer 3b over oxide layer 3a, forming emitter window 4 by etching a predetermined region of oxide layer 3, forming n− type emitter region 5a, forming oxide side wall 6, and forming n+ type emitter region 5b.

The above mentioned production method is as follows:

The n− buried layer and n+ type epitaxial layer 1 are grown over the p type substrate and then oxide layer 3a is formed using an annealing process. Subsequently, ions are implanted into a predetermined region of epitaxial layer 1 using a conventional method for fabricating a bipolar transistor.

As a result, p type base region 2 is formed consisting of p− type region 2a and p+ type region 2b.

Oxide layer 3b is formed over oxide layer 3a using a chemical vapor deposition (CVD) process.

Accordingly, a layer of oxide 3 is formed comprising oxide layers 3a and 3b.

A predetermined region of oxide layer 3 is etched such that an emitter window is formed.

N− type ions are implanted and diffused in base region 2 through emitter window 4 such that n− type emitter region 5a is formed. After the deposition of oxide layer 3, a dry etching process is performed. Oxide sidewall 6 is thus formed in emitter window 4.

N+ type ions are implanted and diffused in n− type emitter region 5a through emitter window 4 and restricted by previously formed oxide sidewall 6 such that n+ type emitter region 5b is formed therein as shown in FIG. 1.

Emitter region 5 is shown consisting of n− type emitter region 5a and n+ type emitter region 5b.

Subsequently, oxide layer 3 formed over p type base region 2 is etched such that a base window results.

After performance of the above-mentioned steps, a well known gate formation process is performed.

Hence, in a conventional production method, after n− type ions are implanted and oxide sidewall 6 is formed over n− type ion implanted region 5a, n+ type ions are implanted.

As a result, because ion implanted regions are activated during the annealing process, the conventional method for fabricating a bipolar transistor is disadvantageous since it results in the formation of a deep junction.

Furthermore, silicon overetch existing due to the formation of oxide sidewall 6 acts as a trap creating a peak field under oxide layer 3 deteriorating a current handling capability to the oxide sidewall 6 and so on. Hence, such a prior art method bipolar transistor fabrication can not be relied upon in production of a submicron grade of emitter of polycrystalline silicon.

FIG. 2 is a vertical sectional view showing a second method for forming a conventional bipolar transistor.

FIG. 2 shows a bipolar transistor having a laterally graded emitter which includes polycrystalline silicon sidewall 7 for improving a hot carrier phenomenon. The method for forming such bipolar transistor includes a first step of growing a second conductivity type buried layer (not shown) and epitaxial layer 1 over a first conductivity type substrate (not shown), a second step of growing oxide layer 3a over epitaxial layer 1, a third step of forming a first conductivity type base region 2 over a predetermined region of epitaxial layer 1, a fourth step of forming oxide layer 3 by growing an oxide layer 3b over oxide layer 3a, a fifth step of forming an emitter window over a predetermined region of first conductivity type base region 2 by etching oxide layer 3, a sixth step of forming a second conductivity type n− low concentration polycrystalline silicon sidewall 7 using a polycrystalline silicon deposition process and implanting to form sidewall 7 along emitter window 4, a seventh step of forming a second conductivity type n+ high concentration polycrystalline silicon region by a polycrystalline silicon deposition process and implanting, and an eighth step of diffusing emitter region 5 using an ion diffusion process.

The above-mentioned second conventional production method is summarized as follows.

The buried layer and n+ type epitaxial layer 1 are grown over p type substrate and then oxide layer 3 is formed over epitaxial layer 1 using an annealing process.

Ions are implanted and diffused in a predetermined region of epitaxial layer 1 using well-known bipolar transistor fabrication techniques.

As a result, p type base region 2 comprising p− type region 2a and p+ type region 2b is formed.

Oxide layer 3b is grown over oxide layer 3a using a chemical vapor deposition (CVD) process to form oxide layer 3.

The predetermined region of oxide layer 3 is etched such that emitter window 4 is formed over p− type base region.

After formation of n− type polycrystalline silicon layer, a dry etching is performed such that n− type polycrystalline silicon sidewall 7 is formed in emitter window 4.

N+ type polycrystalline silicon 8 is also formed in emitter window 4 limited only by the formation of n− type polycrystalline silicon sidewall 7. Finally, n+ type polycrystalline silicon is formed using a photolithographic etching technique which contacts with p− type base region 2a.

While a rapid thermal annealing (RTA) or a normal annealing process is performed, n+ type polycrystalline silicon 8 and sidewall 7 are employed as the diffusion source. N+ type emitter region 5b and the n− type emitter regions 5a are formed in p− type base region by self-aligning n+ type emitter region 5b with n+ type polycrystalline silicon 8 and n− type emitter regions 5a with sidewalls 7.

At this time, polycrystalline silicon sidewalls 7 are doped by the regions of n+ type polycrystalline silicon 8 making contact therewith.

The above conventional bipolar transistor fabrication techniques are disadvantageous. The single crystal silicon layer and the polycrystalline silicon layer cannot be selectively etched by means of a reactive ion etching (RIE) process during formation of n− type polycrystalline silicon sidewall 7 such that etching can be easily stopped. Further, such an emitter diffused transistor construction having a laterally graded emitter structure cannot be easily formed given existing dopant diffusivity characteristics.

SUMMARY OF THE INVENTION

The object of the present invention is to overcome the above-mentioned problems.

The present invention provides a method for producing a bipolar transistor which prevents a transistor degradation phenomenon, due to stress resulting from a reduction of a lateral electric field intensity, by grading an emitter junction by means of a step of refilling polycrystalline silicon in an emitter window, and selectively and easily performing an RIE process on formed n− type polycrystalline silicon sidewalls.

To achieve the above objection, a method of fabricating a bipolar transistor having a laterally graded emitter is achieved by employing a polycrystalline silicon refill method which improves a hot carrier phenomenon. The fabrication method includes a first step of growing a second conductivity type buried layer and an epitaxial layer over a first conductivity type substrate;

- a second step of growing a first oxide layer over the epitaxial layer;
- a third step of forming a first conductivity type base region over a predetermined region of the epitaxial layer;
- a fourth step of successively forming a second oxide layer and a nitride layer over the first oxide layer;
- a fifth step of forming an emitter window, using a first etching process, over a predetermined region of the second oxide layer;
- a sixth step of forming sidewalls of low concentration polycrystalline silicon in the emitter window by successively performing deposition of polycrystalline silicon, ion implanting, and a second etching process;
- a seventh step of performing a third etching process;
- an eighth step of forming a polyemitter of high concentration polycrystalline silicon by successively performing a deposition of polycrystalline silicon and n+ ion implanting; and
- a ninth step of diffusing an emitter region during an annealing process step.

BRIEF DESCRIPTION OF THE DRAWINGS

The above objects and features of the present invention will be apparent from the following detailed description when read in conjunction with the accompanying drawings.

DETAILED DESCRIPTION OF THE PREFERRED EMBODIMENTS

FIG. 3 shows a method of producing an NPN transistor formed with a bipolar or BiCMOS process according to the present invention.

Figure 1:
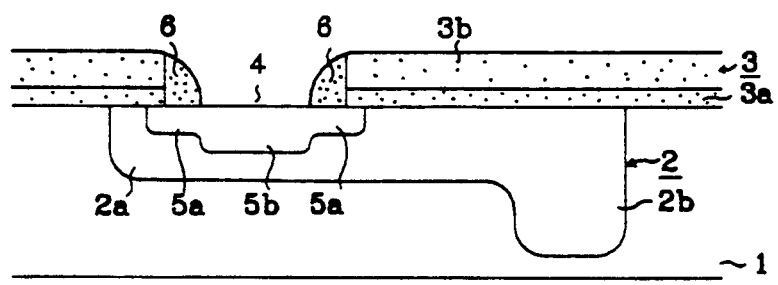
FIG. 1 is a vertical sectional view illustrating a conventional bipolar transistor having a sidewall made of oxide.
Figure 2:
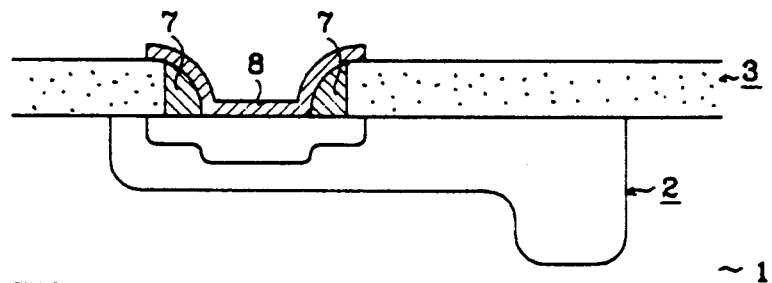
FIG. 2 is a vertical sectional view illustrating a second conventional bipolar transistor having a sidewall made of polycrystalline silicon.
Figure 3A:
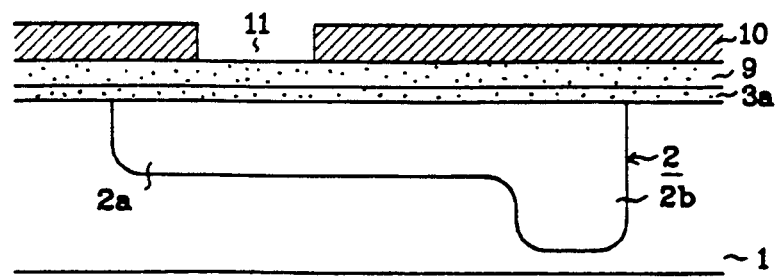
FIGS. 3A-3E are vertical sectional views illustrating a method of fabricating a bipolar transistor according to the present invention.

As shown in FIG. 3A, after an n+ buried layer (not shown) and n− type epitaxial layer 1 is grown over a p type substrate (not shown), oxide layer 3a formed with an annealing process is grown over epitaxial layer 1 to a thickness of 600 Å. Acceptor ions are implanted and diffused in a predetermined region of epitaxial layer 1 by means of a conventional technique associated with the production of bipolar transistors.

As a result, p type base region 2 is formed comprising p− type region 2a and p+ type region 2b.

Oxide layer 9 is then grown over oxide layer 3a and formed using an annealing process to a thickness of 2000–3000 Å. Nitride layer 10 is similarly formed to a thickness of 4000–5000 Å over oxide layer 9.

A predetermined region of nitride layer 10 and oxide layer 9 is etched such that emitter window 11 is formed on oxide layer 9.

Figure 3B:
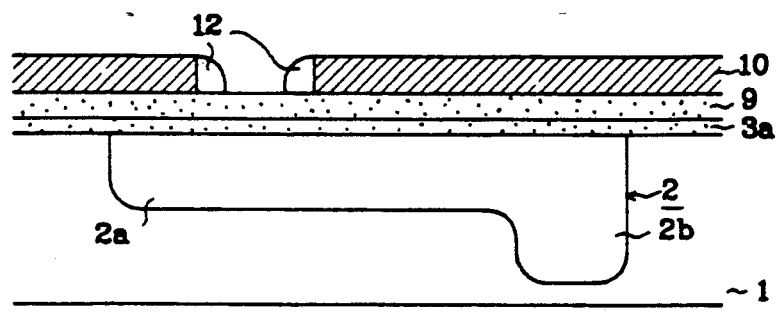

Subsequently, an n− type polycrystalline silicon layer formed thereon is selectively etched with an RIE technique such that n− type polycrystalline silicon sidewall 12 is formed in emitter window 11 as shown in FIG. 3B.

Figure 3C:
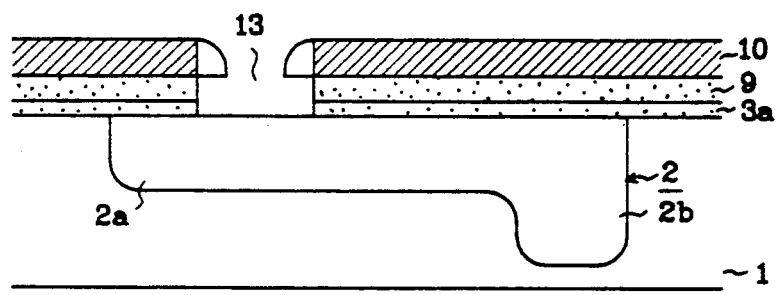

The oxide under sidewall 12 is then removed with a HF or BOF solvent as shown in FIG. 3C.

Figure 3D:
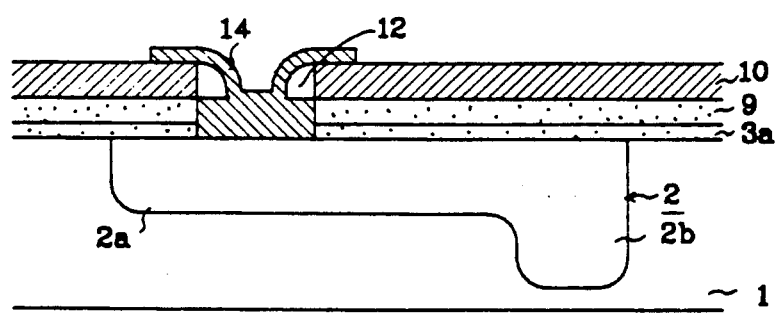

In FIG. 3D, n+ type polycrystalline silicon is formed in resultant emitter window 13 now etched. N+ type polycrystalline silicon 14 is formed contacting the p+ type base region using photolithographic etching.

Figure 3E:
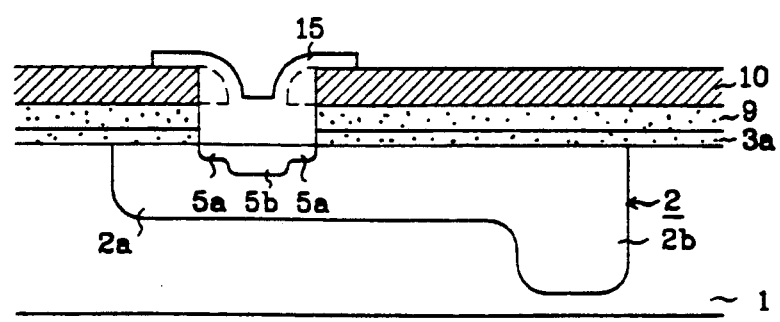

As shown in FIG. 3E, during a rapid thermal annealing (RTA) process, or an equivalent annealing process, the n+ type polycrystalline silicon 14 and the n− type polycrystalline silicon sidewalls 12 are employed as a diffusion source for forming n type emitter region 5.

N type emitter region 5 is shown comprising n+ type emitter region 5b and n− type emitter region 5a formed along p− type base region 2 by self-aligning n+ type emitter region 5b with n+ type polycrystalline silicon 14 and n− type emitter region 5a with sidewalls 12.

At this time, sidewalls 12 are doped by the polycrystalline silicon regions of n+ type polycrystalline silicon 14 resulting in n+ type polycrystalline silicon 15 being formed.

Subsequent steps for completing fabrication of the bipolar transistor semiconductor devices are well-known and not a part of this invention.

The bipolar transistor semiconductor device of the present invention overcomes the disadvantage of the conventionally fixed etch stop by supplanting the oxide layer under the sidewalls which have been formed on the walls of the nitride layer, with a sidewall of n+ polycrystalline silicon.

Furthermore, the effective emitter region is increased by the sidewall of n− type polycrystalline silicon such that the devices current handling capability is improved. In addition, a doping distribution of the laterally graded emitter junction can be easily obtained by refilling with polycrystalline silicon.

Because the shallowness of each layer of oxide can be selectively and easily controlled, a thickness of the sidewall can be more easily regulated so that the present invention can easily raise the integrated density of the bipolar transistor.

While the invention has been described in connection with what is presently considered to be the most practical embodiment, it is to be understood that the invention is not limited to the disclosed embodiment, but, on the contrary, is intended to cover various modifications and equivalent arrangements included within the spirit and scope of the appended claims.

We claim:

1. A method for manufacturing a bipolar transistor semiconductor device having a laterally graded emitter, the method comprising the steps of:

forming an epitaxial layer disposed on a first conductivity type semiconductor substrate, said epitaxial layer being of a second conductivity type;

forming a base region of the second conductivity type in said epitaxial layer;

growing a first oxide layer on said epitaxial layer;

growing a second oxide layer on said first oxide layer;

forming a nitride layer over said second oxide layer;

etching a predetermined region of said nitride layer to form an emitter window;

depositing polycrystalline silicon of a low concentration polycrystalline silicon within the emitter window to form sidewalls of low concentration polycrystalline silicon therein by using a photolithography mask pattern, etching the portion of said first and second oxide layers disposed below the surface of said emitter window, including portions below said sidewalls, to form a deeper emitter window;

filling said deeper emitter window, defined by the window area around the periphery of said sidewalls, with a polycrystalline silicon material;

ion implanting a high impurity concentration into said filled deeper emitter window, and forming an emitter electrode region having high concentration polycrystalline silicon using a photolithography process; and diffusing, using a thermal annealing process, an emitter diffusion region into the base region formed in said epitaxial layer.

2. The method of claim 1, wherein said first conductivity type is p type.

3. The method of claim 1, wherein said second conductivity type is n type.

4. The method of claim 1, wherein in said diffusing step said sidewalls of low concentration polycrystalline silicon and said filled emitter window of high concentration polycrystalline silicon serve as the diffusion source.

5. The method of claim 1, wherein said emitter diffusion region includes first portions of low impurity concentration disposed below said sidewalls of low concentration polycrystalline silicon and a second portion of high impurity concentration disposed below said deeper emitter window but not including the regions defined by said first portions of low impurity concentration.

6. The method of claim 1, wherein said sidewalls are doped by the high concentration polycrystalline silicon resulting in said sidewalls having a higher concentration polycrystalline silicon material.

* * * * *